(12) United States Patent
Gibson

(10) Patent No.: US 8,707,736 B2
(45) Date of Patent: Apr. 29, 2014

(54) METHOD AND APPARATUS FOR MANUFACTURING SOLAR CONCENTRATORS USING GLASS PROCESS

(75) Inventor: Kevin R. Gibson, Redwood City, CA (US)

(73) Assignee: Solaria Corporation, Fremont, CA (US)

( * ) Notice: Subject to any disclaimer, the term of this patent is extended or adjusted under 35 U.S.C. 154(b) by 932 days.

(21) Appl. No.: 12/178,561

(22) Filed: Jul. 23, 2008

(65) Prior Publication Data

US 2009/0038343 A1 Feb. 12, 2009

Related U.S. Application Data

(60) Provisional application No. 60/954,021, filed on Aug. 6, 2007.

(51) Int. Cl.
| | |
|---|---|
| C03B 13/08 | (2006.01) |
| C03B 18/02 | (2006.01) |
| C03B 18/14 | (2006.01) |

(52) U.S. Cl.
CPC .............. *C03B 13/08* (2013.01); *C03B 18/02* (2013.01); *C03B 18/14* (2013.01)
USPC ............................................................ 65/94

(58) Field of Classification Search
CPC ........ C03B 13/08; C03B 18/02; C03B 23/004
USPC ........................ 65/60.1, 97, 100, 105, 174, 94
See application file for complete search history.

(56) References Cited

U.S. PATENT DOCUMENTS

| | | | |
|---|---|---|---|
| 3,700,714 A | 10/1972 | Hamilton et al. | |
| 3,865,673 A * | 2/1975 | DeTorre | 428/43 |
| 4,029,519 A | 6/1977 | Schertz et al. | |
| 4,091,798 A | 5/1978 | Kudret | |
| 4,097,308 A | 6/1978 | Klein et al. | |
| 4,118,249 A | 10/1978 | Graven et al. | |
| 4,122,833 A | 10/1978 | Kudret | |
| 4,143,234 A | 3/1979 | Johnson et al. | |
| 4,166,917 A | 9/1979 | Dorfeld et al. | |
| 4,170,507 A | 10/1979 | Keeling et al. | |

(Continued)

OTHER PUBLICATIONS

International Search Report and Written Opinion of PCT Application No. PCT/US08/71127, date of mailing Oct. 22, 2008, 10 pages total.

*Primary Examiner* — Matthew Daniels
*Assistant Examiner* — Cynthia Szewczyk
(74) *Attorney, Agent, or Firm* — Richard T. Ogawa; Ogawa P.C.

(57) ABSTRACT

A method for manufacturing a glass concentrator for a solar module. The method includes providing a glass material in a molten state and processing the glass material in the molten state to form a ribbon glass including a first surface and a second surface. Additionally, the method includes subjecting the first surface to one or more drum members to form a plurality of concentrating structures while continuously passing the ribbon glass via the second surface over a plurality of rollers. Each of the concentrating structures includes an aperture region, an exit region, and one or more reflection regions. The aperture region is configured to receive incoming light and the one or more reflection regions are configured to concentrate the received incoming light to the exit region. The method further includes cutting the ribbon glass into one or more sheets of glasses including a predetermined number of the plurality of concentrating structures.

17 Claims, 4 Drawing Sheets

(56) References Cited

U.S. PATENT DOCUMENTS

| | | | |
|---|---|---|---|
| 4,291,191 A | 9/1981 | Dahlberg | |
| 4,293,192 A | 10/1981 | Bronstein | |
| 4,295,463 A | 10/1981 | Citron | |
| 4,333,447 A | 6/1982 | Lemrow et al. | |
| 4,361,136 A | 11/1982 | Huang | |
| 4,404,422 A | 9/1983 | Green et al. | |
| 4,440,153 A | 4/1984 | Melchior | |
| 4,449,514 A | 5/1984 | Selcuk | |
| 4,454,371 A | 6/1984 | Folino | |
| 4,457,297 A | 7/1984 | Sobczak et al. | |
| 4,463,749 A | 8/1984 | Sobczak et al. | |
| 4,511,618 A | 4/1985 | Duchene et al. | |
| 4,571,812 A | 2/1986 | Gee | |
| 4,589,191 A | 5/1986 | Green et al. | |
| 4,683,154 A | 7/1987 | Benson et al. | |
| 4,691,994 A | 9/1987 | Tveryanovich | |
| 4,746,347 A * | 5/1988 | Sensi | 65/94 |
| 4,848,319 A | 7/1989 | Appeldorn | |
| 4,863,224 A | 9/1989 | Tveryanovich | |
| 4,964,713 A | 10/1990 | Goetzberger | |
| 4,999,059 A | 3/1991 | Bagno | |
| 5,080,725 A | 1/1992 | Green et al. | |
| 5,118,361 A | 6/1992 | Fraas et al. | |
| 5,153,780 A | 10/1992 | Jorgensen et al. | |
| 5,167,724 A | 12/1992 | Chiang | |
| 5,174,275 A | 12/1992 | Holland | |
| 5,224,978 A | 7/1993 | Hermant et al. | |
| 5,240,510 A | 8/1993 | Goldade et al. | |
| 5,245,985 A | 9/1993 | Holland | |
| 5,261,970 A | 11/1993 | Landis et al. | |
| 5,344,496 A | 9/1994 | Stern et al. | |
| 5,356,488 A | 10/1994 | Hezel | |
| 5,365,920 A | 11/1994 | Lechner | |
| 5,395,070 A | 3/1995 | Wilk | |
| 5,449,626 A | 9/1995 | Hezel | |
| 5,460,659 A | 10/1995 | Krut | |
| 5,466,301 A | 11/1995 | Hammerbacher et al. | |
| 5,498,297 A | 3/1996 | O'Neill et al. | |
| 5,517,339 A | 5/1996 | Riccobono et al. | |
| 5,529,054 A | 6/1996 | Shoen | |
| 5,542,409 A | 8/1996 | Sampayo | |
| 5,564,411 A | 10/1996 | Gerics | |
| 5,660,644 A | 8/1997 | Clemens | |
| 5,707,459 A | 1/1998 | Itoyama et al. | |
| 5,735,966 A | 4/1998 | Luch | |
| 5,782,993 A | 7/1998 | Ponewash | |
| 5,787,878 A | 8/1998 | Ratliff, Jr. | |
| 5,790,304 A | 8/1998 | Sanders et al. | |
| 5,851,309 A | 12/1998 | Kousa | |
| 5,865,905 A | 2/1999 | Clemens | |
| 5,877,874 A | 3/1999 | Rosenberg | |
| 5,882,434 A | 3/1999 | Horne | |
| 5,936,777 A | 8/1999 | Dempewolf | |
| 5,959,787 A | 9/1999 | Fairbanks | |
| 5,964,216 A | 10/1999 | Hoffschmidt et al. | |
| 6,008,449 A | 12/1999 | Cole | |
| 6,049,035 A | 4/2000 | Tsuri et al. | |
| 6,057,505 A | 5/2000 | Ortabasi | |
| 6,091,017 A | 7/2000 | Stern | |
| 6,091,020 A | 7/2000 | Fairbanks et al. | |
| 6,092,392 A | 7/2000 | Verlinden et al. | |
| 6,107,564 A | 8/2000 | Aguilera et al. | |
| 6,118,067 A | 9/2000 | Lashley et al. | |
| 6,134,784 A | 10/2000 | Carrie et al. | |
| 6,167,724 B1 | 1/2001 | Pozivil | |
| 6,199,404 B1 * | 3/2001 | Kawai et al. | 65/102 |
| 6,274,402 B1 | 8/2001 | Verlinden et al. | |
| 6,274,860 B1 | 8/2001 | Rosenberg | |
| 6,294,723 B2 | 9/2001 | Uematsu et al. | |
| 6,309,901 B1 | 10/2001 | Tahon et al. | |
| 6,323,415 B1 | 11/2001 | Uematsu et al. | |
| 6,333,457 B1 | 12/2001 | Mulligan et al. | |
| 6,337,283 B1 | 1/2002 | Verlinden et al. | |
| 6,387,726 B1 | 5/2002 | Verlinden et al. | |
| 6,423,568 B1 | 7/2002 | Verlinden et al. | |
| 6,429,037 B1 | 8/2002 | Wenham et al. | |
| 6,433,913 B1 | 8/2002 | Bauer et al. | |
| 6,440,769 B2 | 8/2002 | Peumans et al. | |
| 6,479,744 B1 | 11/2002 | Tsuzuki et al. | |
| 6,528,716 B2 | 3/2003 | Collette et al. | |
| 6,528,718 B2 | 3/2003 | Yoda et al. | |
| 6,612,705 B1 | 9/2003 | Davidson et al. | |
| 6,619,282 B1 | 9/2003 | Murtha | |
| 6,620,995 B2 | 9/2003 | Vasylyev et al. | |
| 6,666,207 B1 | 12/2003 | Arkas et al. | |
| 6,676,263 B2 | 1/2004 | Winston | |
| 6,700,054 B2 | 3/2004 | Cherney et al. | |
| 6,700,055 B2 | 3/2004 | Barone | |
| 6,804,062 B2 | 10/2004 | Atwater et al. | |
| 6,815,070 B1 | 11/2004 | Burkle et al. | |
| 6,822,157 B2 | 11/2004 | Fujioka | |
| 6,843,573 B2 | 1/2005 | Rabinowitz et al. | |
| 6,849,797 B2 | 2/2005 | Koyanagi et al. | |
| 2002/0007845 A1 | 1/2002 | Collette et al. | |
| 2002/0018308 A1 | 2/2002 | Winston | |
| 2002/0075579 A1 | 6/2002 | Vasylyev et al. | |
| 2002/0139414 A1 | 10/2002 | Vasylyev et al. | |
| 2003/0015233 A1 | 1/2003 | Barone | |
| 2003/0037569 A1 | 2/2003 | Arbab et al. | |
| 2003/0037814 A1 | 2/2003 | Cohen et al. | |
| 2003/0081333 A1 | 5/2003 | Winston | |
| 2003/0095340 A1 | 5/2003 | Atwater et al. | |
| 2003/0121542 A1 | 7/2003 | Harneit et al. | |
| 2003/0156337 A1 | 8/2003 | Davidson et al. | |
| 2003/0201007 A1 | 10/2003 | Fraas et al. | |
| 2004/0016454 A1 | 1/2004 | Murphy et al. | |
| 2004/0021964 A1 | 2/2004 | Rabinowitz et al. | |
| 2004/0079114 A1 * | 4/2004 | Aitken et al. | 65/64 |
| 2004/0084077 A1 | 5/2004 | Aylaian | |
| 2004/0097012 A1 | 5/2004 | Weber et al. | |
| 2004/0123895 A1 | 7/2004 | Kardauskas et al. | |
| 2004/0134531 A1 | 7/2004 | Habraken et al. | |
| 2004/0194820 A1 | 10/2004 | Barone | |
| 2004/0243364 A1 | 12/2004 | Wendelin et al. | |
| 2004/0246605 A1 | 12/2004 | Stiles et al. | |
| 2005/0070059 A1 | 3/2005 | Blakers et al. | |
| 2005/0081908 A1 | 4/2005 | Stewart | |
| 2005/0081909 A1 | 4/2005 | Paull | |
| 2005/0087294 A1 | 4/2005 | Rabinowitz | |
| 2006/0054211 A1 | 3/2006 | Meyers | |
| 2006/0105897 A1 | 5/2006 | Kasuga et al. | |
| 2006/0272698 A1 * | 12/2006 | Durvasula | 136/246 |
| 2006/0283495 A1 * | 12/2006 | Gibson | 136/244 |

* cited by examiner

METHOD AND APPARATUS FOR MANUFACTURING SOLAR CONCENTRATORS USING GLASS PROCESS

CROSS-REFERENCES TO RELATED APPLICATIONS

This application claims priority to U.S. Provisional Application No. 60/954,021 filed Aug. 6, 2007, commonly assigned, and hereby incorporated by reference here.

BACKGROUND OF THE INVENTION

The present invention relates generally to solar energy techniques. In particular, the present invention provides a method and apparatus for manufacturing a glass concentrator for a solar module. More particularly, the present invention provides a method and system for making glass concentrator using one or more drum members to form predetermined shaped concentrating structures on ribbon glass during a float glass process. Merely by way of example, the invention has been applied to solar panels, commonly termed modules, but it would be recognized that the invention has a much broader range of applicability.

As the population of the world increases, industrial expansion has lead to an equally large consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies developed often capture solar energy, concentrate it, store it, and convert it into other useful forms of energy.

Solar panels have been developed to convert sunlight into energy. As merely an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successful for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of silicon bearing wafer materials. Such wafer materials are often costly and difficult to manufacture efficiently on a large scale. Availability of solar panels is also somewhat scarce. That is, solar panels are often difficult to find and purchase from limited sources of photovoltaic silicon bearing materials. These and other limitations are described throughout the present specification, and may be described in more detail below.

From the above, it is seen that techniques for improving solar devices is highly desirable.

BRIEF SUMMARY OF THE INVENTION

The present invention relates generally to solar energy techniques. In particular, the present invention provides a method and apparatus for manufacturing a glass concentrator for a solar module. More particularly, the present invention provides a method and system for making glass concentrator using one or more drum members to form predetermined shaped concentrating structures on ribbon glass during a float glass process. Merely by way of example, the invention has been applied to solar panels, commonly termed modules, but it would be recognized that the invention has a much broader range of applicability.

In a specific embodiment, the present invention provides a method for manufacturing a glass concentrator for a solar module. The method includes providing a glass material in a molten state and processing the glass material in the molten state to form a ribbon glass including a first surface and a second surface. Additionally, the method includes subjecting the first surface to one or more drum members to form a plurality of concentrating structures while continuously passing the ribbon glass via the second surface over a plurality of rollers. Each of the concentrating structures includes an aperture region, an exit region, and one or more reflection regions. The aperture region is configured to receive incoming light from the second surface and the one or more reflection regions are configured to concentrate the received incoming light to the exit region. The exit region is smaller in area than the aperture region. Moreover, the method includes cutting the ribbon glass into one or more sheets of glasses. Each sheet of glass includes a predetermined number of the plurality of concentrating structures.

Furthermore, certain embodiments provide a method including a process step of processing the cut sheet of glass to form a glass concentrator. One embodiment includes partially polishing the reflection regions. Another embodiment includes coating an anti-reflection film on the second surface. Further another embodiment includes performing glass tempering or lamination process. Still yet another embodiment includes forming a peripheral region along the edge of the sheet of glass and assembling with one or more packaged photovoltaic cells and a matched back cover for manufacture of a solar module.

Many benefit are achieved by way of the present invention over conventional techniques. For example, the present technique provides an easy to use process that relies on conventional technology of making float glass. Additionally, the method provides a process that is compatible with conventional process technology without substantial modifications to conventional equipment and processes. Preferably, the invention provides a flexible way using one or more drum members combining at least one roller to form concentrating structure into a surface of a ribbon glass while the ribbon glass being passed between the one or more drum members and the roller. The one or more drum members can be pre-configured to include one or more shaped moldings so that the desired shape of concentrating structure can be formed automatically. The float glass process allows both surfaces, with or without the concentrating structure, being fire finished so that there may need no extra grinding or polishing. In a preferred embodiment, the invention provides a glass concentrator having a characteristic from the thickness of the sheet of glass to sustain a load of at least 2400 Pa uniformly applied on the surface for 1 hour in two cycles. Also in a preferred embodiment, the invention provides a method to make a glass concentrator having a geometric concentration characteristic with an aperture to exit ratio in a range from about 1.8 to about 4.5 and polished side regions with RMS roughness less than 30 nm. The use of concentrator according to the present invention helps the solar conversion module having less photovoltaic material per surface area (e.g., 80% or less, 50% or less) than conventional solar panel module. In another embodiment, the invention provides a solar module with the glass concentrator as a top cover over one or more packaged photovoltaic cells assembled with a rigid back cover. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention relates generally to solar energy techniques. In particular, the present invention provides a method and apparatus for manufacturing a glass concentrator for a solar module. More particularly, the present invention provides a method and system for making glass concentrator using one or more drum members to form predetermined shaped concentrating structures on ribbon glass during a float glass process. Merely by way of example, the invention has been applied to solar panels, commonly termed modules, but it would be recognized that the invention has a much broader range of applicability.

Figure 1:
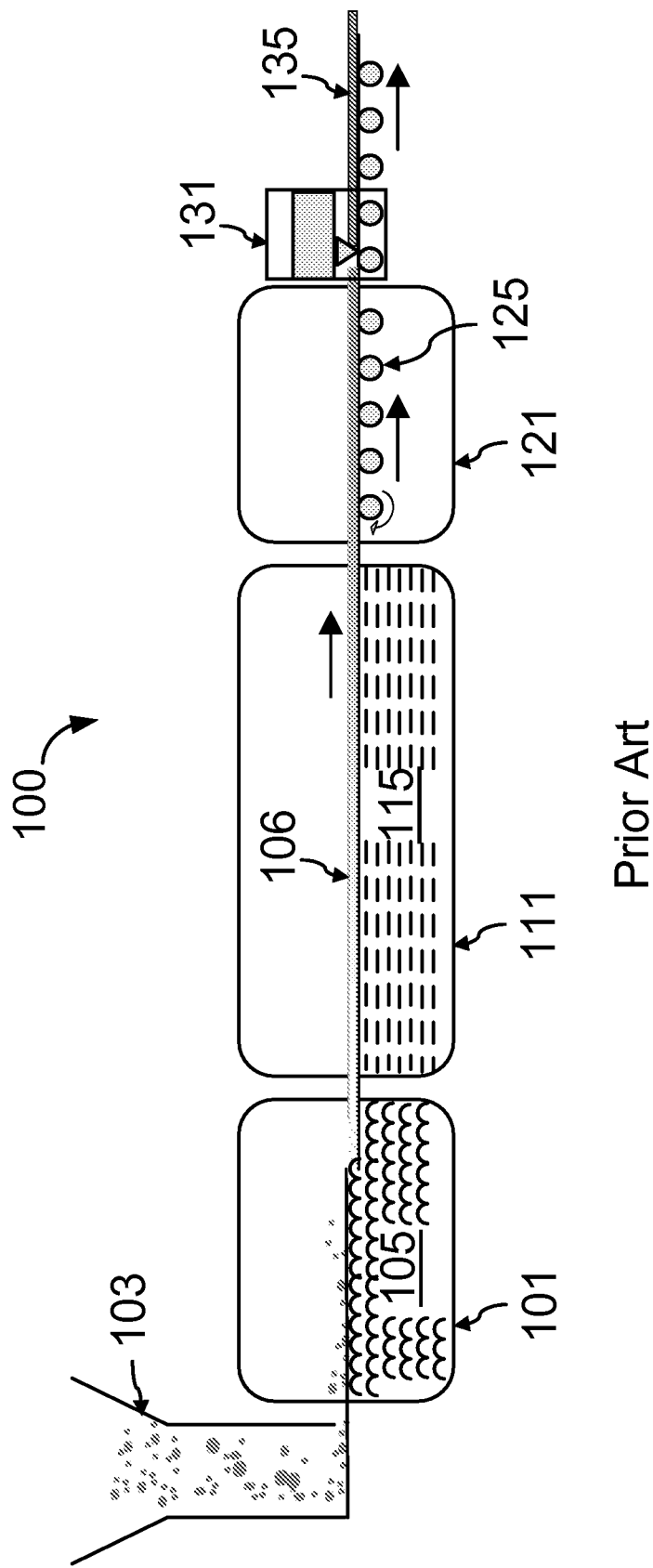
FIG. 1 is a simplified diagram illustrating a conventional system for glass manufacture using a floating process.

FIG. 1 is a simplified diagram illustrating a conventional system for glass manufacture using a floating process. As shown, the system 100 includes at least a furnace 101, a raw material feeder 103, a float bath 111, a spreader chamber 121 with a plurality of rollers 125, a cutting apparatus 131. The furnace 101 is configured to receive raw materials through a feeder 103 from a batch where many components such as Soda lime glass, silica sand, Calcium oxide, Soda, Magnesium, etc. are weighted and mixed. The furnace 101 usually is a wide tank made of refractory materials and is capable of being heated above 2000° C. The batched raw materials in the furnace become a molten glass 105 at a temperature of approximately 1500° C. In one example, the furnace can be a multiple chambered furnace so that the operation can be carefully controlled. In another example, the furnace may be large enough to hold as many as 2,000 tons of molten glass.

The float bath 111 contains full of molten tin 115 at a temperature of about 1000° C. The float bath 111 is directly coupled to the furnace and configured to receive the molten glass 105. In one example, the molten glass 105 in the last chamber of the furnace may be controlled to be at a temperature of about 1100° C. and is floated onto the bath of molten tin 115. The molten glass 105 is highly viscous and the tin which is very fluid at this temperature do not mix so that the molten glass floats on the surface of molten tin and spreads out in the from of a long strip to form a ribbon glass 106. In another example, the float bath 111 may include multiple cooling apparatuses (not shown) so that the floating ribbon glass 106 can be cooled stage by stage. Near an exit of the float bath 111 the cooled ribbon glass 106 (may be at a temperature of about 600° C.) becomes hard enough to be passed out over a plurality of rollers 125 into a spreader chamber 121 where the continuously passing ribbon glass 106 can be further annealed or cooled. Then the annealed ribbon glass 106 can be passed through a cutting apparatus 131 which is programmed to cut the ribbon glass 106 into one or more sheets of glasses 135 one after another each with a certain predetermined size before each sheet of glass 135 is transported for further processing.

Figure 2:
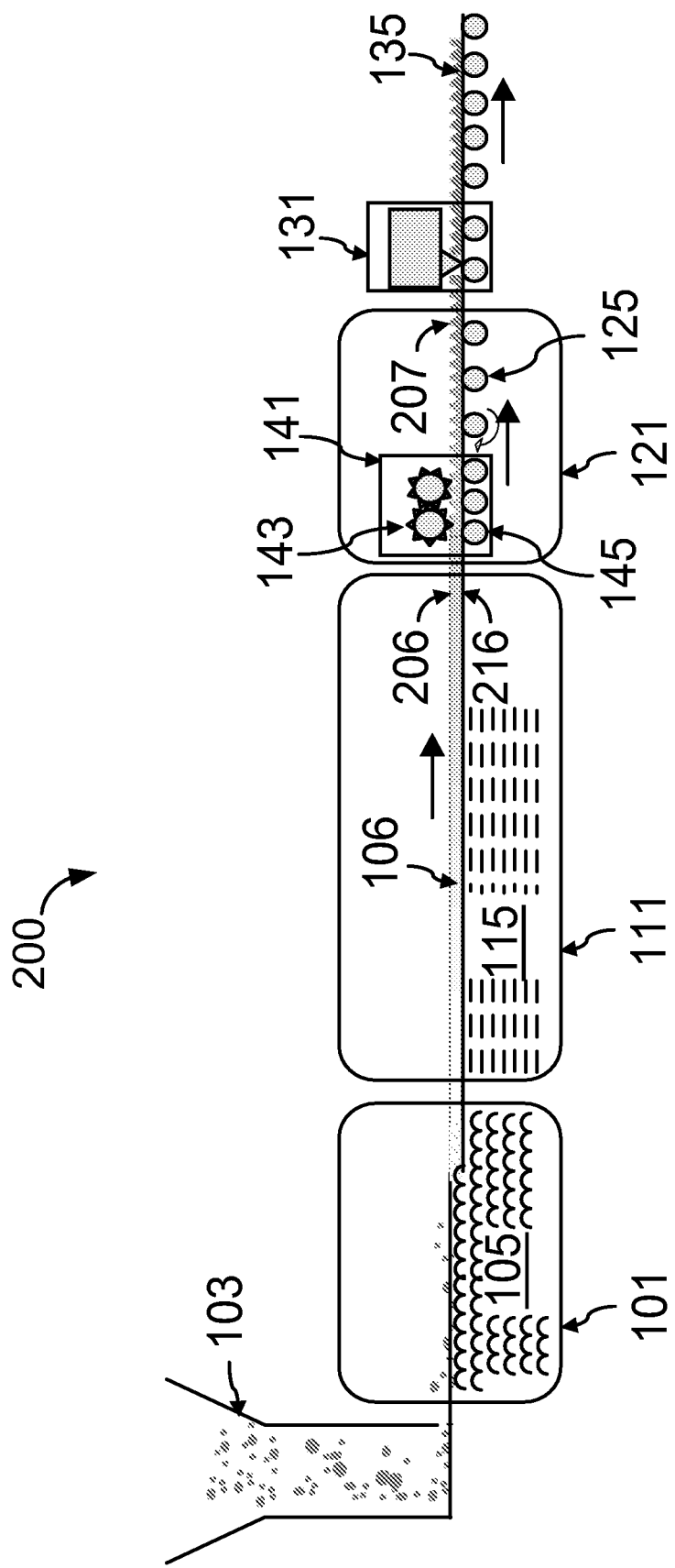
FIG. 2 is a simplified diagram illustrating a system for making a glass concentrator based on a floating glass process using one or more drum members according to an embodiment of the present invention.

FIG. 2 is a simplified diagram illustrating a system for making a glass concentrator based on a floating glass process using one or more drum members according to an embodiment of the present invention. This diagram is merely an example, which should not unduly limit the scope of the claims herein. One of ordinary skill in the art would recognize other variations, modifications, and alternatives. As shown, the system 200 includes most components of the conventional system 100 to take advantage of the matured float glass technology. In addition, the system 200, for making a glass concentrator for solar module, at least adds a drum roller 141 including a combination of one or more drum members 143 and one or more rollers 145. In one embodiment, the rolling processor 141 is installed within the spreader chamber 121. In another embodiment, the rolling processor 141 is disposed near the exit of the float bath 111. Furthermore, in one specific embodiment, the one or more drum members includes predetermined moldings that are configured to have predetermined shape capable of forming desired structure on a material surface that is mechanically deformable. Of course, there can be many alternatives, variations, and modifications.

In one embodiment, as shown in FIG. 2, the floating ribbon glass 106 is formed in the float bath 111 as described in FIG. 1. In particular, the floating ribbon glass 106 is spread out as a thickness of running strip of glass material including a first surface 206 and a second surface 216. The second surface 216 is interfaced with the surface of molten tin 115, while the first surface 206 faces up. In certain embodiments, the float bath is associated with one or more toothed rollers (not shown) on top of the floating ribbon glass to pull or push the molten glass sideways with certain confined working width to obtain a desired thickness measured between the first surface and the second surface. In a specific embodiment, the float bath may be associated with one or more cooling apparatuses so that the ribbon glass 106, as it drifts (indicated by a arrow pointing to the right in FIG. 2) towards an exit of the float bath, becomes harder due to reduced temperature. In one example, the temperature of the ribbon glass is reduced to about 600° C. near the exit of the float bath 111. At this temperature the ribbon glass 106 becomes hard enough to be passed out of the bath of molten tin 115. Particularly, the second surface 216 of the ribbon glass 106 starts to be in contact with one of a plurality of rollers 125, which moves the ribbon glass 106 continuously into the spreader chamber 121.

Inside the spreader chamber 121, which also acts as an cooling/annealing chamber, the ribbon glass may be further cooled to a desired temperature at which the glass takes on the properties of an elastic solid. For example, the temperature can be 500° C. or lower. In other words, when subjecting to certain hard tooling, the surface of the glass can be at least partially restructured. Particularly, the ribbon glass 106 at the desired temperature is guided into the drum roller 141. The drum roller 141 includes a gap with a predetermined spatial opening between the one or more drum members 143 (top side) and one or more rollers 145 (bottom side). In a specific embodiment, the spatial opening of the gap is smaller or about the same of the thickness of the ribbon glass so that the moldings on the one or more drum members are able to engrave at least partially into the first surface 206.

As shown in FIG. 2, the drum roller 141 includes certain protruding moldings pre-built on circular faces of the one or more drum member 143. In one example, the each molding structure is shaped like a triangle in its cross-section and uniform in perpendicular direction. As the molding of the drum member is engaged with the deformable first surface of the ribbon glass, a triangular-shaped notch is formed into the first surface. In one embodiment, the size of the molding is selected to ensure a depth of the notch structure formed into the first surface is only a small fraction of the ribbon glass thickness. In another embodiment, multiple such molding structures are distributed with a predetermined space around the circular face of each drum member. As the ribbon glass is continuously passed by via the second surface over the one or more rollers 145, one after another similar notches can be formed sequentially formed with a desired spacing between each other. In yet another embodiment, a quenching device (not shown) may be associated with the drum roller 141 so that once the one or more notches are formed they can be quenched to maintain the structure. For example, the glass temperature should be reduced to below 300° C. within a few sec by blast cooling. Therefore, the original flat first surface 206 of the ribbon glass 106 turns into a structured new surface 207 after being passed through the drum roller 141. In an specific embodiment, this structured new surface can be further processed to take properties of light concentrators. Of course, there can be many variations, alternatives, and modifications. For example, the molding structure can be selected to have other shapes, sizes, or spacing, etc.

After forming the structured surface 207, the ribbon glass can be further annealed in the spreader chamber 121. For example, certain thermal process such as tempering can be performed to strengthen the glass. Further, the ribbon glass continues to be cooled in the open air and passed out of the spreader chamber 121 over more rollers under the second surface. As shown in both FIG. 1 and FIG. 2, a cutting apparatus 131 coupled to the spreader chamber 121 is applied to cut the ribbon glass sequentially into one or more sheets of glasses. The cutting can be first induced by one or more scribing operations. For example, as the ribbon glass is passed through the cutting apparatus 131, along one or more predetermined lines on the second surface 216 the glass are scribed. Subsequently, the ribbon glass 106 is broken/cut along these scribed lines to form a sheet of glass 135 by removing the extra edge pieces. In one embodiment, the edges of each sheet of glass 135 are trimmed at the end of the cutting process. In another embodiment, the cutting process results a sheet of glass including a predetermined number of structures on the first surface, which has a desired length and width to form a glass concentrator for solar module. Of course, there can be many variations, alternatives, and modifications.

Based on the system setup schematically illustrated in FIG. 2, according to a specific embodiment, a method for making the glass concentrator for manufacture of solar conversion module can be outlined as follows:
1. Providing a glass material in a molten state;
2. Processing the glass material in the molten state;
3. Forming a ribbon glass including a first surface and a second surface;
4. Subjecting first surface to one or more drum members to form a plurality of concentrating structures;
5. Cutting the ribbon glass sequentially into one or more sheets of glasses;
6. Processing a sheet of glass to form a glass concentrator, the sheet of glass including a predetermined number of concentrating structures.

As shown, embodiments of the present invention provides an efficient way of making a glass concentrator with a plurality of concentrating structures for a solar module. Using this method both light concentration function and other characteristics required for module industrial qualification standards can be taken cared in a same process flow. The method can be implemented based on established conventional float glass manufacturing technology. These and other details of the present method can be found throughout the present specification and more particularly below.

Figure 3:
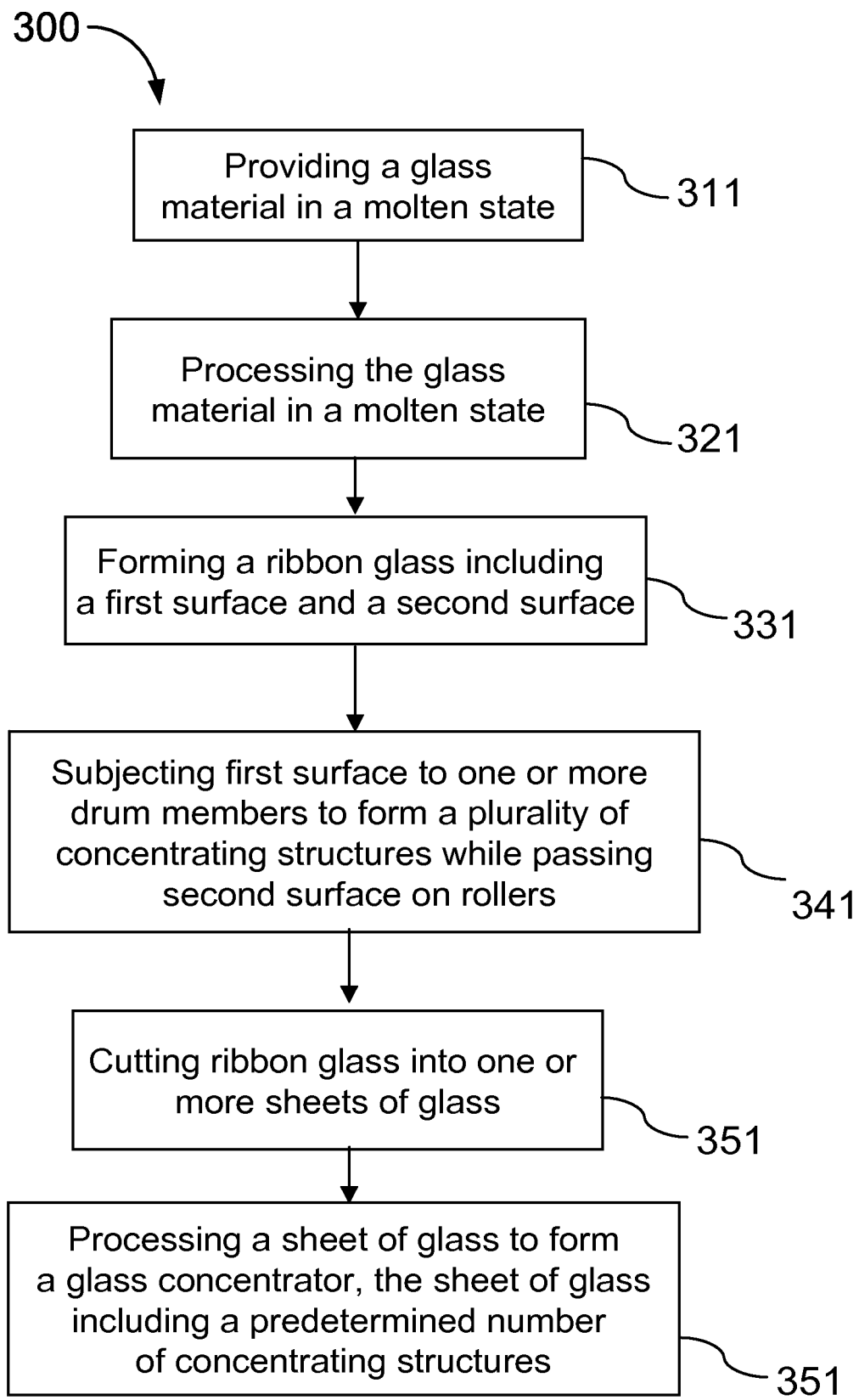
FIG. 3 is a simplified flowchart illustrating a method of making a glass concentrator for solar module according to an embodiment of the present invention.

FIG. 3 is simplified flowchart illustrating a method of making a glass concentrator for solar module according to an embodiment of the present invention. This diagram is merely an example, which should not unduly limit the scope of the claims herein. One of ordinary skill in the art would recognize other variations, modifications, and alternatives. As shown, the method 300 includes a step of providing a glass material in a molten state (311). In one embodiment, a number of raw materials including Silica sand, limestone, Calcium oxide, cerium oxide, iron oxide, salt cake, etc. as well as recycled glass are collected and mixed into batches. The batched raw materials are passed from a mixing apparatus to a furnace where they are melted at a temperature of approximately 1500° C. In another embodiment, the furnace may be a multi-chambered furnace with separate temperature control for each chamber. For example, the furnace is furnace 101 shown in FIG. 2. The controlled material compositions of certain materials may affect many final physical characteristics of the glass concentrator to be assembled for solar module, including photon absorption, mechanical strength, stress distribution, or refractive index value etc. Of course, there can be other variations, modifications, and alternatives.

Depending on the embodiment, the method 300 may include one or more steps of processing the glass material in the molten state (321). One process may include drawing the molten glass at about 1100° C. onto a float bath. The float bath is a bath of molten tin at a temperature of about 1000° C. Depending on the application, the float bath can have various confined lateral dimensions. For example, it may have a rectangular shape with a confined width and a long path. As an example, the float bath is float bath 111 shown in FIG. 2. As being drawn onto the tin bath, the molten glass spreads out due to the gravity and surface tension but is confined by the designed lateral dimension. In one embodiment, the glass at the above temperature is highly viscous and the tin is very fluid so that both the glass and the tin do not mix and the contact surface between these two materials is perfectly flat. In other words, the method 300 includes a step of forming a ribbon glass floated on the molten tin with a working width and a thickness measured between a (top) first surface and a second surface contacting the tin surface (331). For example, the ribbon glass formed in the ribbon glass 106. Of course, there can be other variations, modifications, and alternatives.

Depending on the embodiment, the process 331 of forming the ribbon glass may include controlling an even thickness between the first surface and the second surface for entire ribbon glass. For example the controlling process may include rolling the first surface with toothed rollers to pull or push the molten glass sideways especially near the edges of the float bath. According to certain embodiments, the thickness of the ribbon glass needs to be sufficient for forming a glass concentrator that should possess required load sustenance and impact hail resistance characteristics for solar module. The ribbon glass formed using the above process based on the system setup described in FIG. 2 can be a range from 1.1 mm to 25 mm. In an example for making glass concentrator, the thickness can be at least 5 mm. In another example, the thickness of ribbon glass for making glass concentrator is about 8 to 9 mm.

Additionally, the process 331 of forming a ribbon glass may also include controlling temperature of the ribbon glass as it continuously flows on top of tin bath. as mentioned above, several cooling devices can be associated with the float bath during the flow path of the ribbon glass. Particularly, as the front of ribbon glass near the end of flow path, the ribbon glass can be cooled to a temperature of about 600° C. At this temperature the ribbon glass becomes hard enough to be passed out of tin bath and over a plurality of metallic rollers. For example, these metallic rollers are part of a spreader chamber 121 shown in FIG. 2. In one embodiment, the cooled ribbon glass can be continuously transported via the second surface over these rollers within the spreader chamber. Inside the spreader chamber, the ribbon glass can be further processed by a combination of annealing, surface firing, blast cooling, etc during a long path depending on applications. In one embodiment, at least one process is to prepare the ribbon glass for surface restructuring. In another embodiment, at least another process is for enhancing the optical or mechanical properties for glass concentrator application.

Referring the FIG. 3 again, the method 300 includes a process of subjecting the first surface to one or more drum members to form a plurality of concentrating structures (341). As seen in FIG. 2, at a certain stage inside the spreader chamber the ribbon glass 106 can be passed through a drum roller 141. Particularly, the ribbon glass is rolling via the second surface over a plurality of rollers, passing through a gap between one or more drum members and one or more rollers. The gap includes a spatial opening pre-adjusted to adapt the thickness of ribbon glass. The one or more drum members include multiple moldings pre-disposed around the circular face of the drum member with a predetermined spacing. As the ribbon glass 106 passes by, the first surface 206 is subjecting the moldings of the one or more drum members. In other words, these moldings can engrave into the first surface at least partially (depending on various factors including the gap spacing, ribbon glass thickness and the size of the moldings). In one embodiment, the ribbon glass under the process of subjecting the first surface to mold engraving has been in a state at which the temperature of ribbon glass is about 500° C. with desired elastic properties.

With proper designed spatial position and shape, the moldings on the drum members can turn an original flat first surface into a patterned surface with a plurality of concentrating structures. In one embodiment, the shaped molding is an elongated rod with a triangular cross section shape. The formed concentrating structure on the first surface is an elongated truncated pyramid shape separated by a triangular shaped notch. As the ribbon glass continuously passes through the drum roller, substantially the same structure can be formed one after another on the first surface. For example, the newly re-structured surface becomes the surface 207 shown in FIG. 2, while the second surface is still a flat surface 216. In an specific embodiment, the process 341 of subjecting the first surface to the one more drum member to form a plurality concentrating structures includes a quenching process to freeze the formed elongated truncated pyramid shape structure separated by a triangular shaped notch includes inherently a light concentrating characteristic. The bottom base of the pyramid shape structure can act as an aperture region for collecting light (coming from the second surface). The top base of the truncated pyramid acts as an light exit region. In one embodiment, the spatial distance between the aperture region to the exit region is about 1.8 mm. One side of the exit region connects to one side of the aperture region by a side region. An opposite side of the exit region connects to the opposite side of the aperture region by another side region. These side regions act as reflector to direct light from aperture region towards the exit region which has a reduced dimension compared to the aperture region, for example in a 2:1 ratio, thus achieving a light concentration function.

Referring back to FIG. 3, the method 300 further includes cutting the ribbon glass sequentially into one or more sheets of glasses (351). As shown in FIG. 2, a cutting apparatus 131 is coupled to the spreader chamber 121 to receive the ribbon glass after it is processed by the drum roller 141. After the process with drum roller, the ribbon glass may be further annealed and cooled in the air. Depending on the embodiment, the annealing process helps to reduce the stress within the ribbon glass and improve the load sustenance and impact resistance. At least one process results in a proper state that the cutting process can performed. In one embodiment, the cutting process 351 may start with performing a mechanical scribing along certain predetermined lines while the ribbon glass is continuously passed by. The scribing lines include those periodically across the working width of the ribbon glass and those parallel to the long edges of the ribbon glass, or if necessary, include various predetermined lines within the middle regions of the ribbon glass. Afterwards, the ribbon glass is cut into one or more sheets or plates of glasses. The size or shape can have different variations depending on the applications. In one example, a sheet of glass is a rectangular shape measured by 1 meters times 1.6 meters. In another embodiment, the cutting process 351 may be carried by energetic laser beams.

After the cutting process 351 a sheet of glass is formed, the method 300 can include further processing the sheet of glass to form a glass concentrator (361) for solar module. Depending on the applications, one or more processes may include trimming the edges of the sheet of glass after cutting. In one embodiment, the size of the sheet of glass is predetermined so that in both directions a predetermined number of concentrating structures are included. In one example, the concentrating structures are truncated pyramid shape elongated in one direction and disposed parallel one next to another in another direction. Each elongated concentrating structure has a length substantially the same as the dimension from one edge of the sheet to an opposite edge. In another embodiment, certain process is performed to polish (at least partially) the side regions of each concentrating structure for enhancing light reflection thereof. For example, the polishing can be performed using a flame polishing process which uses a nearly one-dimension gas-burner. In yet another embodiment, one or more process may include depositing thin films on the flat second surface (after loaded the sheet of glass in a separate chamber). The second surface of the sheet of glass would be used as the top surface of the solar module front cover where the sun light will be collected. The thin film coating may include an anti-reflection coating, an infrared blocking coating, and an anti-scratch coating. In yet still another embodiment, further processes may be performed with the sheet of glass to enhance its mechanical strength. For example, tempering process and lamination process can be performed separately. Of course, there can be many alternatives, variations, and modifications.

Although the method 300 has been specifically shown by those process steps mentioned in above paragraphs, there can be many other variations, modifications, and alternatives. Some of the processes may be removed or be performed in different order. Other processes may be added or used to replace some of above processes. For example, the subjecting the first surface to one or more drum members with shaped moldings for forming a plurality of concentrating structures may be performed after cutting process, or be replaced by casting or etching directed into the sheet of glass. In another example, the flame polishing process may be replaced by an acid polishing or a mechanical process. Additionally, the side regions of the concentrating elements can also be deposited with a reflectivity enhancement coating.

Figure 4:
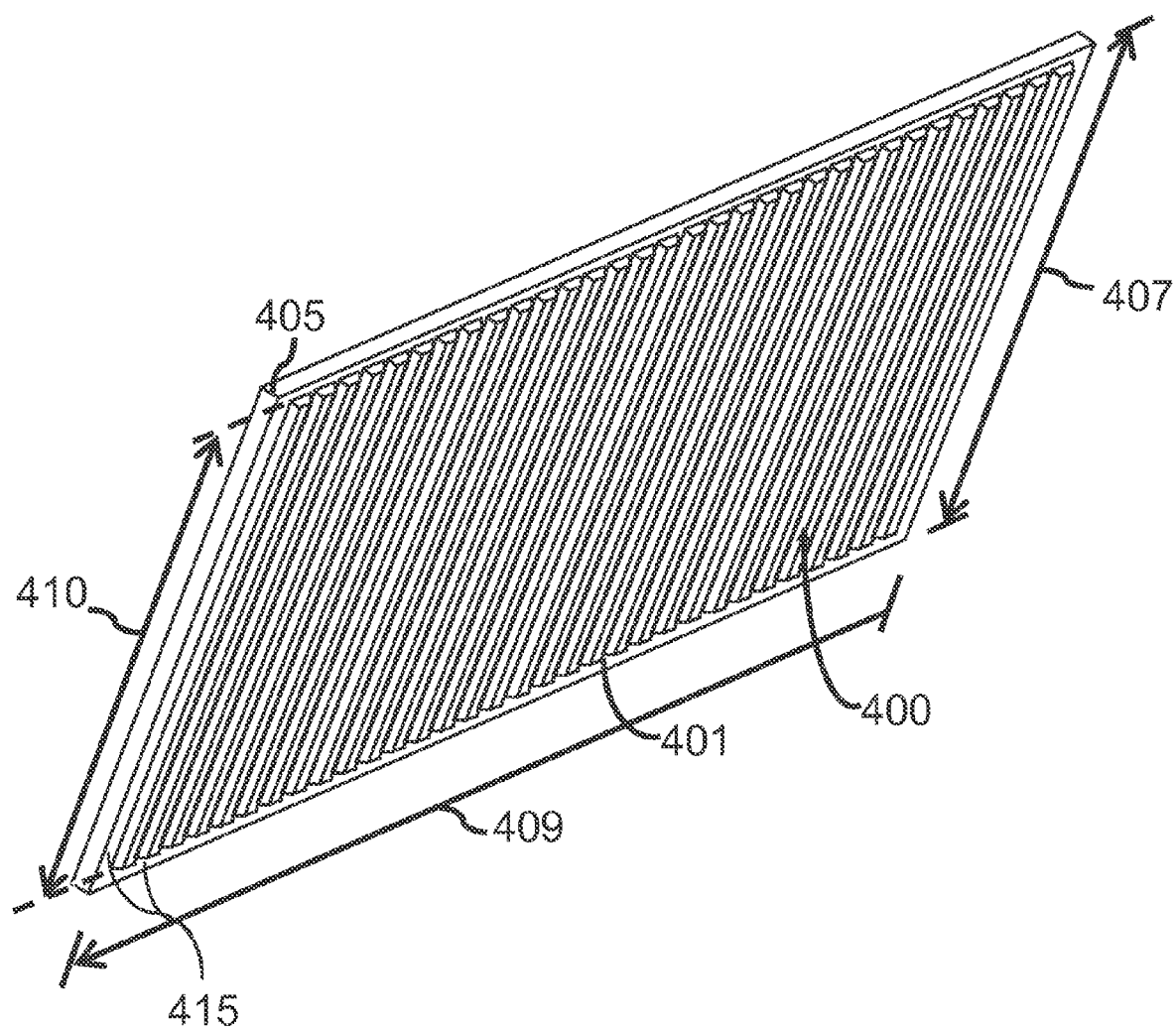
FIG. 4 is a simplified diagram illustrating a glass concentrator for a solar module according to an embodiment of the present invention.

FIG. 4 is a simplified diagram illustrating a glass concentrator for a solar concentrator module according to an embodiment of the present invention. This diagram is merely an example, which should not unduly limit the scope of the claims herein. One of ordinary skill in the art would recognize other variations, modifications, and alternatives. As shown is a prospective view of a glass concentrator, which can be made using the method 300. The glass concentrator is a single sheet of glass with a plurality of concentrating structures 400 formed on a first surface 401 (visible side in FIG. 4). The glass concentrator also has a second surface 401 (not directly seen), a thickness 405 defined between the first surface and the second surface, a first dimension 407, a second dimension 409. In one embodiment, each of the plurality of elongated concentrating structures 400 has a length 410 and is disposed in parallel one-next-to-another extending from one edge of the sheet of glass to an opposite edge. In a specific embodiment, the elongated concentrating structure is parallel to the side of the sheet of glass with the first dimension 407. In yet another embodiment, the plurality of concentrating structures 400 occupies the entire area of the first surface 401 excluding a peripheral region 415. In one example, the peripheral region has a width of about 10 mm. Of course, there can be other variations, modifications, and alternatives.

According to another embodiment of the present invention, the glass concentrator as shown in FIG. 4 is direct used for making a solar concentrator module. In particular, the glass concentrator has a rectangular shape easy for manufacture and use. The rectangular shape is characterized by the first dimension 407 and the second dimension 409. In one embodiment, the first dimension 407 is selected to be about 1 meter and the second dimension is correspondingly selected to be about 1.6 meters. In another embodiment, with such a size selected above, the peripheral region 415 is for clamping or other packaging purpose. Of course, there can be other variations, modifications, and alternatives for the dimensions selected for the concentrator.

As a preferred embodiment of the present invention, the glass concentrator will be directly used as a light receiving top cover member for the solar conversion module. For example, the second surface of the glass concentrator will become the top surface of the solar module. In order to satisfy the industry qualification standard regarding to module's mechanical toughness, the thickness 405 between the first surface and the second surface is selected to be at least 3.2 mm according to an embodiment of the present invention. For example, the thickness 405 can be 5 mm. In another example, the thickness 405 can be 6 mm. In yet another example, the thickness 405 can be about 7.2 mm. Such the selection of the thickness 405 provides an important load sustenance characteristic and impact hail resistance characteristic to the concentrator of the solar module, although other factors including the composition profile, stress profile, packaging method etc also contribute to these physical characteristics. For example, in one embodiment, the glass can be replaced by a laminated glass made of polymer which may provide better impact resistance with a same or smaller thickness compared to a conventional solar glass. According to IEC 61215, the solar module should be able to sustain a load of 2400 Pa uniformly applied to the surface of the module for 1 hour in two cycles. Additionally, the solar module should be able to resist a hail impact represented by an ice ball of 25 mm diameter directed at a speed of at least 23 meter per second to eleven (random) locations on a entire surface region of about 1 m×1.6 m. According to certain embodiments, the combination of the selection of those physical dimensions and compositions of the glass concentrator result in a satisfaction of all the Industrial Qualification Standards including the mentioned load test or impact hail test. For example, Industrial Qualification Standards for solar module includes IEC 61215, IEC 61730, and UL 1703. Of course, there can be other variations, modifications, and alternatives for these dimension numbers including the first dimension, second dimension, the first thickness, and the peripheral region dimension.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing a glass concentrator for a solar module, the method comprising:

providing a glass material in a molten state;

processing the glass material in the molten state to form a ribbon glass including a first surface and a second surface; and subjecting the first surface to one or more drum members to form a plurality of concentrating structures while continuously passing the ribbon glass via the second surface over a plurality of rollers, each of the concentrating structures including an aperture region, an exit region, and one or more reflection regions, the reflection region configured to receive incoming light and the one or more reflection regions configured to concentrate the received incoming light to the exit region, the exit region being smaller in area than the aperture region: and cutting the ribbon glass into one or more sheets of glasses, each sheet of glass including a predetermined number of the plurality of concentrating structures and being a soda lime glass composition;

wherein each concentrating structure can be disposed physically one-next-to-another on the first surface in a first direction, the first direction being parallel to passing direction of the ribbon glass;

wherein each of the concentrating structure can be elongated along a second direction, the second direction being substantially perpendicular to the first direction;

using at least one sheet of glass including the predetermined number of the plurality of concentrating structures for the solar module;

wherein each of the concentrating structures is characterized as an elongated truncated pyramid structure comprising:
- a bottom base with a first area is the aperture region;
- a top base with a second area is the exit region, the second area being one half or smaller than the first area; and
- two side regions are the reflection regions, the two side regions respectively connecting one side of the exit region with one side of the aperture region and another side of the exit region with another side of the aperture region;

wherein each of the concentrating structures is characterized by a geometric concentration characteristic with an aperture to exit ratio in a range from about 1.8 to about 4.5; and wherein each of the concentrating structures is characterized by an RMS roughness less than 30 nm.

2. The method of claim 1 wherein the processing the glass material in the molten state to form a ribbon glass comprises a float glass process, wherein the ribbon glass is a thickness of strip material floating on a bath of molten tin, the thickness is measured between the first surface and the second surface.

3. The method of claim 2 wherein the ribbon glass can be cooled sufficiently to a first temperature so that the ribbon glass becomes hard enough to be passed over the plurality of rollers from the bath of molten tin.

4. The method of claim 3 wherein the ribbon glass at the first temperature comprises an elastically deformable surface characteristic at least down to a depth, the depth being less than or equal to the thickness of the ribbon glass.

5. The method of claim 3 wherein the first temperature is about 600° C.

6. The method of claim 5 further comprising:
cooling the ribbon glass after passing the gap to maintain the formed plurality of concentrating structures on the first surface.

7. The method of claim 1 wherein the subjecting the first surface to one or more drum members to form a plurality of concentrating structures comprises a rolling process, wherein the ribbon glass is passed through a gap between the one or more drum members and one or more rollers, the one or more drum members include predetermined moldings to form a plurality of concentrating structures into the first surface, the one or more rollers belong to a plurality of rollers supporting the second surface.

8. The method of claim 1 wherein the cutting the ribbon glass comprises:
scribing the ribbon glass at predetermined positions;
cutting the ribbon glass along the scribed lines to form one or more sheets of glasses; and trimming edges of each sheet of glass.

9. The method of claim 1, and further comprising:
processing the one or more sheets of glasses; and forming a glass concentrator for a solar module from each of the one or more sheets of glasses.

10. The method of claim 9 wherein the processing the one or more sheets of glasses comprises at least partially flame polishing the one or more reflection regions of each concentrating structures on the first surface.

11. The method of claim 9 wherein the processing the one or more sheets of glasses further comprises performing reflection enhancement coating on the one or more reflection regions of each concentrating structures on the first surface.

12. The method of claim 9 wherein the processing the one or more sheets of glasses further comprises performing a tempering process.

13. The method of claim 9 wherein the processing the one or more sheets of glasses further comprises performing a lamination process to bond the second surface with a sheet of flat glass without concentrating structures using a sheet of plastic.

14. The method of claim 9 wherein the processing the one or more sheets of glasses further comprises performing one or more anti-reflection and/or anti-infrared coatings overlying the second surface.

15. The method of claim 9 wherein the glass concentrator formed for solar module comprises a load sustenance characteristic from the thickness, the load being at least of 2400 Pa uniformly applied on the second surface for 1 hour in two cycles.

16. The method of claim 15 wherein the glass concentrator formed for solar module further comprises a hail impact resistance characteristic of the sheet of glass, the impact hail being an ice ball with at least of 25 mm diameter directed at a speed of at least 23 meter per second to at least eleven locations on the second surface.

17. A method for manufacturing a glass concentrator for a solar module, the method comprising:
providing a glass material in a molten state;
processing the glass material in the molten state to form a ribbon glass including a first surface and a second surface; and
subjecting the first surface to one or more drum members to form a plurality of concentrating structures while continuously passing the ribbon glass via the second surface over a plurality of rollers, each of the concentrating structures including an aperture region, an exit region, and one or more reflection regions, the reflection region configured to receive incoming light and the one or more reflection regions configured to concentrate the received incoming light to the exit region, the exit region being smaller in area than the aperture region: and cutting the ribbon glass into one or more sheets of glasses, each sheet of glass including a predetermined number of the plurality of concentrating structures and being a soda lime glass composition; and
blast cooling the ribbon glass;
wherein each concentrating structure can be disposed physically one-next-to-another on the first surface in a first direction, the first direction being parallel to passing direction of the ribbon glass;
wherein each of the concentrating structure can be elongated along a second direction, the second direction being substantially perpendicular to the first direction;

using at least one sheet of glass including the predetermined number of the plurality of concentrating structures for the solar module;
wherein each of the concentrating structures is characterized as an elongated truncated pyramid structure comprising:
   a bottom base with a first area is the aperture region;
   a top base with a second area is the exit region, the second area being one half or smaller than the first area; and
   two side regions are the reflection regions, the two side regions respectively connecting one side of the exit region with one side of the aperture region and another side of the exit region with another side of the aperture region;
wherein each of the concentrating structures is characterized by a geometric concentration characteristic with an aperture to exit ratio in a range from about 1.8 to about 4.5; and
wherein each of the concentrating structures is characterized by an RMS roughness less than 30 nm.

* * * * *